July 31, 1962 G. O. K. SCHNEIDER 3,047,817

ELECTRONIC RING CIRCUIT DISTRIBUTOR INCLUDING SELECTABLE INTERRUPTING MEANS AND OUTPUT GATES TO PROVIDE NON-OVERLAPPING OPERATION

Filed Feb. 24, 1958

INVENTOR.
GERHARD O.K. SCHNEIDER

BY F. H. Henson

ATTORNEY 3,047,817

ELECTRONIC RING CIRCUIT DISTRIBUTOR INCLUDING SELECTABLE INTERRUPTING MEANS AND OUTPUT GATES TO PROVIDE NON-OVERLAPPING OPERATION

Gerhard O. K. Schneider, Rochester, N.Y., assignor to General Dynamics Corporation, Rochester, N.Y., a corporation of Delaware Filed Feb. 24, 1958, Ser. No. 716,948
13 Claims. (Cl. 331—57)

This invention relates in general to electronic ring circuits and, more particularly, to electronic distributor circuits which comprise electronic ring circuits as principal elements thereof.

Electronic distributors are used to produce a plurality of nonoverlapping output signals. In some time division multiplex system applications, the electronic distributor is continuously operated and the output signals are utilized to define individual time positions which recur in repetitive time position frames. In other applications, the distributor is used to control the assignment of individual circuits for use in turn by the application of mark signals to conductors individual to those circuits. In the latter application, it is sometimes necessary that the operation of the distributor be arrested after each step so that a mark signal is transmitted to a particular circuit until that circuit is taken into use.

Conventionally, each stage of the ring circuit or counter, which forms the principal element of an electronic distributor, comprises either a vacuum tube or transistor flip-flop circuit and the stepping operation of the ring circuit or counter is controlled by an external pulse generator. Singular non-overlapping output signals are obtained by the gating together of the output signals from the various stages of a binary counter, while output signals are obtained directly from the individual stages of a decimal ring circuit.

It is the general object of this invention to provide a new and improved electronic distributor circuit.

It is a more particular object of this invention to provide a new and improved electronic distributor comprising as a principal element thereof a new and improved ring circuit which is free running, reliable in operation, fast operating, and which comprises a minimum of circuit elements.

The present invention accomplishes the above cited objects by providing an electronic distributor having a ring circuit in which each stage comprises a single inverter amplifier, which may be a transistor. The output circuit of each inverter amplifier is connected to the input circuit of the next succeeding inverter amplifier of the ring circuit by time delay means, which includes a direct current conductive path between said output and input circuits, and since an odd number plurality of inverter amplifiers is provided in the ring circuit, the ring circuit is free running. In the embodiment of the invention disclosed herein, each of the transistor inverter amplifiers of the ring circuit is biased for conduction and for non-conduction when the transistor immediately preceding that transistor is non-conductive and conductive, respectively. Thus, during one cycle of operation of the ring circuit, the odd number transistors become conductive and the even number transistors become non-conductive while during the next succeeding cycle of operation, the even number transistors become conductive and the odd number transistors become non-conductive. Thus, each of the transistors of the ring circuit, in turn, changes its state of conduction during each cycle of operation of the ring circuit. Singular non-overlapping output signals are obtained from the ring circuit by the use of a plurality of two input gating means with each gating means having its two inputs connected to a unique combination of two of said inverter amplifier output circuits. As fully described hereinafter, the disclosed ring circuit can be operated continuously or can be controlled to arrest its operation at any point in its cycle of operation.

Further objects and advantages of the invention will become apparent as the following description proceeds, and features of novelty which characterize the invention will be pointed out in particularity in the claims annexed to and forming a part of this specification.

For a better understanding of the invention, reference may be had to the accompanying drawing which comprises three figures on a single sheet.

Figure 1:
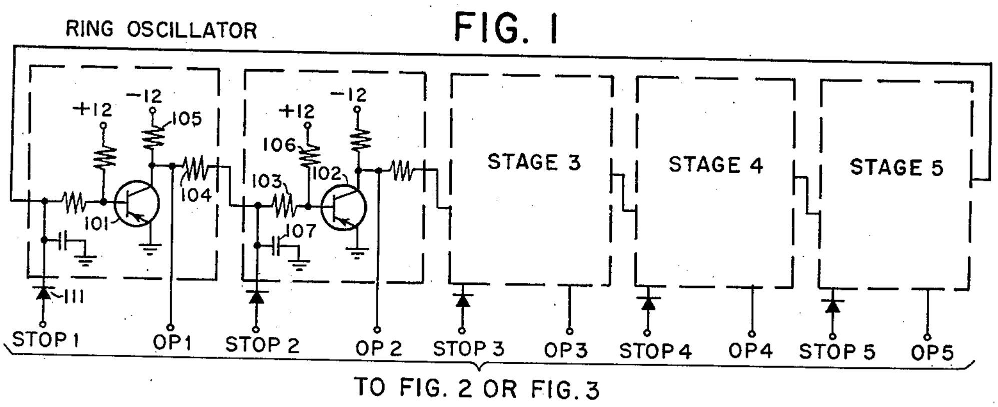
FIG. 1 shows circuit details of a free running electronic ring circuit.

As illustrated, the ring circuit of FIG. 1 comprises five stages but it is to be understood that the ring circuit can comprise any odd number plurality of stages. Each stage of the ring circuit comprises an inverter amplifier transistor, such as transistors 101 and 102 in the first and second stages, respectively, and each transistor of the ring circuit is biased for conduction and for non-conduction when the preceding transistor of the ring circuit is non-conductive and conductive, respectively. Examining stage 2 transistor 102, it can be seen that its emitter is returned to a point of reference or ground potential and that when transistor 101 is non-conductive, the base of transistor 102 is returned to minus twelve volt potential through resistors 103, 104, and 105 and to plus twelve volt potential through resistor 106. Under these conditions, the base of transistor 103 is negative with respect to its emitter, the base emitter junction of transistor 102 is thus biased in the forward direction, and transistor 102 is conductive. When transistor 102 is conductive, ground potential is, of course, applied to output conductor OP2. On the other hand, when transistor 101 is conductive and ground potential appears at its collector, the base of transistor 102 is positive with respect to its emitter, the base emitter junction of transistor 102 is thus biased in the reverse direction, and transistor 102 is non-conductive. When transistor 102 is non-conductive, a negative potential is, of course, applied to output conductor OP2.

Since an odd number plurality of transistors is provided in the ring circuit, no stable condition is possible in the ring circuit. To illustrate the operation of the ring circuit, assume that transistor 102 is conductive, the stage 3 transistor is non-conductive, the stage 4 transistor is conductive, the stage 5 transistor is non-conductive, and that stage 1 transistor 101 has just begun to conduct. Prior to the time that transistor 101 begins to conduct, time delay capacitor 107 is charged to the negative potential appearing at the junction point of resistors 103 and 104 and thus tends to hold said junction point negative for a short time interval after transistor 101 becomes conductive. When capacitor 107 has discharged through resistor 104 toward ground potential at the collector of transistor 101 to the point where the base of transistor 102 becomes slightly positive with respect to its emitter, transistor 102 is rendered non-conductive. When transistor 102 becomes non-conductive, the stage 3 transistor becomes conductive, the stage 4 transistor becomes non-conductive, the stage 5 transistor becomes conductive, and transistor 101 again becomes non-conductive. When transistor 101 becomes non-conductive, capacitor 107 charges toward minus twelve volt potential through resistors 104 and 105 until such time as the base of transistor 102 becomes slightly negative with respect to its emitter and transistor 102 again becomes conductive. Thus, it can be seen that as the operation progresses through the chain, the state of conduction of each transistor is changed from either conductive to non-conductive or from non-conductive to conductive. The speed of operation of the ring circuit is dependent upon the time constant of the delay circuit interconnecting the collector of each transistor and the base of the next succeeding transistor and upon the particular type of transistors used in the circuit. Reliable operation has been achieved by the illustrated ring circuit at speeds exceeding 700 kc.

Figure 2:
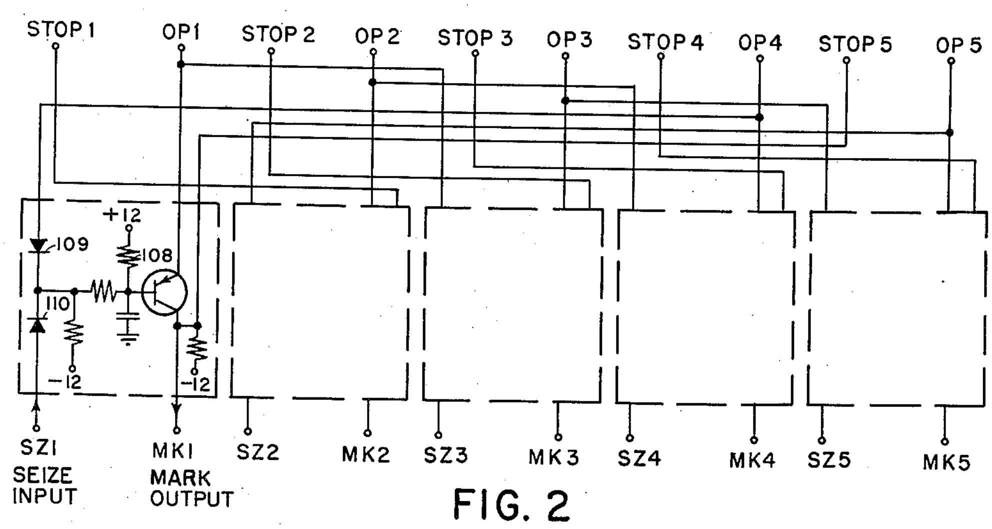
FIG. 2 shows circuit details of a first type of gating means which may be used with the ring circuit of FIG. 1.
Figure 3:
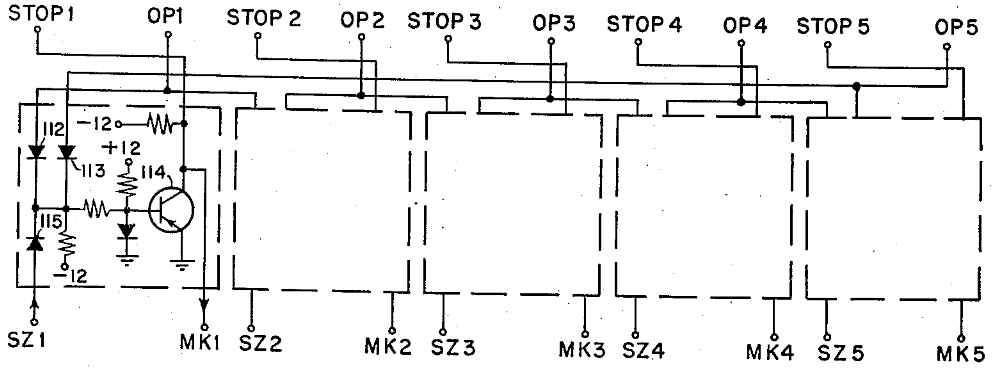
FIG. 3 shows circuit details of a second type of gating means which may be used with the ring circuit of FIG. 1.

Two types of gating circuits have been shown in FIGS. 2 and 3 for deriving progressive, non-overlapping output signals from the ring circuit of FIG. 1. An output conductor and a stop conductor, such as OP1 and STOP1, respectively, are used to interconnect each stage of the ring circuit and each stage of either one of the gating circuits. Also, each stage of each gating circuit has seize and mark conductors, such as SZ1 and MK1, respectively, associated therewith. The electronic distributor, comprising FIGS. 1 and 2 of this application, is also shown and described in conjunction with a queue store circuit in my copending application, Serial No. 729,279, filed April 18, 1958, now Patent 2,923,777, and assigned to the same assignee as the present invention. As fully described in the aforementioned application, each of the circuits controlled by the electronic distributor functions to apply negative potential to an individual seize conductor only when that circuit is demanding service.

The electronic distributor comprising FIGS. 1 and 2 will first be described. First assume that the electronic distributor is used in an application wherein the ring circuit is continuously operated and recurring mark signals are transmitted over conductors MK1–MK5 in continuous sequence. Under these conditions, no connection is made between the stop conductors STOP1–STOP5 of FIGS. 1 and 2 and no connection is made to the seize conductors SZ1–SZ5 of FIG. 2. Each gating means of FIG. 2 has two inputs which are connected to unique combinations of the output circuits of the ring circuit. For example, the first input, namely, the emitter of gating transistor 108 of the first gating means of FIG. 2, is connected to output conductor OP1 and thus to the collector of transistor 101, and the second input, namely, the anode terminal of diode 109, is connected to output conductor OP4 and thus to the collector of the stage 4 transistor which precedes transistor 101 in the ring circuit by an even number. The collectors of the two aforementioned ring circuit transistors are normally at the same potential, either ground or negative potential. In either case, the gating transistor is non-conductive. On alternate cycles of operation of the ring circuit when the potential at the collectors of the aforementioned ring circuit transistors is changing from ground to negative potential, the gating transistor 108 is rendered conductive for the short time interval when the collector of the stage 4 transistor is at negative potential and the collector of transistor 101 is still at ground potential. Thus, since each of the gating means is controlled by a unique combination of ring circuit transistors, ground potential is applied to mark conductors MK1–MK5 in a continuous and repeating sequence. That is, ground potential is applied to conductors MK1, MK3, MK5, MK2 and MK4, in that order and in a repeating sequence.

Next assume that the electronic distributor of FIGS. 1 and 2 is to be used to assign individual circuits for use in turn and, therefore, that connection is made between the stop conductors STOP1–STOP5 of FIGS. 1 and 2 and that an individual seize conductor, such as SZ1, is connected to the anode terminal of a diode corresponding to 110 in each gating means of FIG. 2. As fully explained in the above-identified copending application, a negative potential is applied to the individual seize conductor only when the circuit connected thereto is demanding service. It can be seen that while conductor SZ1 is held at ground potential, thus signifying that the circuit connected thereto is not demanding service, the base of gating transistor 108 is clamped to ground potential and transistor 108 is prevented from becoming conductive regardless of the operated condition of the ring circuit. However, when the circuit connected to conductor SZ1 is demanding service and negative potential is applied to conductor SZ1, transistor 108 is rendered conductive when the ring circuit stage 4 transistor becomes non-conductive and transistor 101 is conductive. When transistor 108 becomes conductive, ground potential is applied to mark conductor MK1 and is also applied over conductor STOP5 to the base of the ring circuit stage 5 transistor through a diode corresponding to 111. Thus, the stage 5 transistor is prevented from becoming conductive and the stepping operation of the ring circuit is arrested so that the ring circuit remains in the operated condition in which transistor 101 and the stage 3 transistor are conductive, and transistor 102, the stage 4 transistor, and the stage 5 transistor are non-conductive. When negative potential is removed from seize conductor SZ1 and ground potential is applied thereto, transistor 108 becomes non-conductive and the ring circuit begins and continues its stepping operation until negative potential is encountered on another seize conductor.

The electronic distributor comprising FIGS. 1 and 3 will now be described. As previously described in conjunction with FIG. 2, if the ring circuit is to be continuously operated, no connection is made between the stop conductors STOP1–STOP5 of FIGS. 1 and 3 and no connection is made to the seize conductors SZ1–SZ5 of FIG. 3. As illustrated, each gating means of FIG. 3 comprises a two input "and" gate for negative signals comprising diodes corresponding to 112 and 113 and an inverter amplifier transistor corresponding to transistor 114. Each gating means of FIG. 3 has its two inputs connected to unique combinations of the output circuits of the ring circuit. For example, the first input of the first gating means of FIG. 3, namely, the anode terminal of diode 112, is connected to output conductor OP1 and thus to the collector of transistor 101, and the second input, namely, the anode terminal of diode 113, is connected to output conductor OP5 and thus to the collector of the stage 5 transistor which precedes transistor 101 in the ring circuit by an odd number. The collectors of the two aforementioned ring circuit transistors are both negative only on alternate cycles of operation of the ring circuit when the stage 5 transistor becomes non-conductive. During the time interval while both transistors are non-conductive, inverter amplifier transistor 114 beomes conductive and ground potential is applied to mark conductor MK1. Since each of the gating means of FIG. 3 is controlled by a unique combination of ring circuit transistors, ground potential is applied to conductors MK1–MK5 in a repeating sequence. That is, ground potential is applied to conductors MK1, MK3, MK5, MK2 and MK4, in that order and in a repeating sequence.

Next assume that the electronic distributor of FIGS. 1 and 3 is to be used to assign circuits for use in turn and therefore that connection is made between the stop conductors STOP1–STOP5 of FIGS. 1 and 3 and that an individual seize conductor, such as SZ1, is connected to the anode terminal of a diode corresponding to 115 in each gating means of FIG. 3. Under these conditions, diodes 112, 113, and 115 form a three-input "and" gate for negative signals, and while ground potential is applied to conductor SZ1, signifying that the circuit connected thereto is not demanding service, the base of transistor 114 is clamped at ground potential and transistor 114 is prevented from becoming conductive regardless of the operated condition of the ring circuit.

However, when the circuit connected to conductor SZ1 is demanding service and negative potential is applied to conductor SZ1, transistor 114 is rendered conductive when ring circuit stage 5 transistor becomes non-conductive and transistor 101 is still non-conductive. When transistor 114 becomes conductive, ground potential is applied to mark conductor MK1 and is also applied to conductor STOP1 and thus through diode 111 to the base of transistor 101. Thus, the stepping operation of the ring circuit is arrested and the ring circuit remains in the setting wherein both the stage 5 transistor and transistor 101 are non-conductive. When negative potential is removed from conductor SZ1 and ground potential is applied thereto by the controlled circuit, the output of the "and" gate goes to ground potential, transistor 114 becomes non-conductive, and the ring circuit begins its stepping operation.

It is to be noted that the circuits herein disclosed all comprise PNP transistors. It is to be understood that NPN transistors could be used in the illustrated circuits if the polarity of the biasing potentials and the diodes used in the circuit are reversed. It should also be apparent that a combination of PNP and NPN transistors can be used in the ring circuit if suitable biasing is provided for the individual stages.

While there has been shown and described what is at present considered to be the preferred embodiments of the invention, modifications thereto will readily occur to those skilled in the art. It is not desired, therefore, that the invention be limited to the embodiments shown and described and it is intended to cover in the appended claims all such modifications as fall within the true spirit and scope of the invention.

What is claimed is:

1. A distributor comprising a ring circuit, said ring circuit comprising an odd number plurality of inverter amplifiers, each of said amplifiers comprising an input circuit and an output circuit, direct current conductive means for connecting the output circuit of each amplifier to the input circuit of the next succeeding amplifier, means including said direct current conductive means for biasing each of said amplifiers for conduction and non-conduction when the next preceding amplifier is non-conductive and conductive, respectively, so that said ring circuit is normally free running, and means for interrupting the operation of said ring circuit at any point in its cycle of operation, said last named means comprising means for maintaining the state of conduction of any one of said amplifiers when the next preceding amplifier changes its state of conduction.

2. A distributor comprising a ring circuit, said ring circuit comprising an odd number plurality of transistors each having a base, an emitter, and a collector, direct current conductive means for coupling the collector of each transistor to the base of the next succeeding transistor, means for biasing the base and emitter of each transistor in the forward direction and in the reverse direction when the transistor immediately preceding that transistor is non-conductive and conductive, respectively, so that said ring circuit is normally free running, and means for interrupting the operation of said ring circuit at any point in its cycle of operation, said last named means comprising means for maintaining the bias of the base and emitter of any one of said transistors in the reverse direction when the transistor immediately preceding that transistor becomes non-conductive.

3. A distributor comprising a ring circuit, said ring circuit comprising an odd number plurality of inverter amplifiers, each of said amplifiers comprising an input circuit and an output circuit, direct current conductive means for connecting the output circuit of each amplifier to the input circuit of the next succeeding amplifier, means including said direct current conductive means for biasing each of said amplifiers for conduction and non-conduction, respectively, when the next preceding amplifier is non-conductive and conductive, respectively, so that said ring circuit is free running, a gating transistor having a base, an emitter, and a collector, means for connecting said emitter to the output circuit of a first one of said amplifiers, means for connecting said base to the output circuit of a second one of said amplifiers preceding said first amplifier in said ring circuit by an even number, an output circuit connected to said collector, and means including said means for connecting the emitter and base of said gating transistor to the output circuits of said first and second amplifiers, respectively, for biasing the base and emitter of said gating transistor in the forward direction to thereby produce a signal in said collector output circuit during each alternate cycle of operation of said ring circuit for the period of time elapsing from the time that said second amplifier changes its state of conduction until said first amplifier changes its state of conduction.

4. A distributor comprising a ring circuit, said ring circuit comprising an odd number plurality of transistors of the same conductivity type and each having a base and a collector, direct current conductive means for coupling the collector of each transistor of the ring circuit to the base of the next succeeding transistor of the ring circuit, means including said direct current conductive means for biasing each of said ring circuit transistors for conduction and non-conduction when the next preceding transistor is non-conductive and conductive, respectively, so that said ring circuit is free running, a gating transistor having a base, an emitter, and a collector, means for connecting the emitter of said gating transistor to the collector of a first one of said ring circuit transistors, means for connecting the base of said gating transistor to the collector of a second one of said ring circuit transistors preceding said first transistor in said ring circuit by an even number, an output circuit connected to the collector of said gating transistor, and means including said means for connecting the emitter and base of said gating transistor to the collectors of said first and said second transistors, respectively, for biasing the base and emitter of said gating transistor in the forward direction to thereby produce a signal in said output circuit during each alternate cycle of operation of said ring circuit for the period of time elapsing from the time that said second transistor changes its state of conduction until said first transistor changes its state of conduction.

5. A distributor comprising a ring circuit, said ring circuit comprising an odd number plurality of transistors of the same conductivity type and each having a base, an emitter, and a collector, direct current conductive means for connecting the collector of each ring circuit transistor to the base of the next succeeding ring circuit transistor, means including said direct current conductive means for biasing each of said ring circuit transistors for conduction and non-conduction when the next preceding transistor is non-conductive and conductive, respectively, so that said ring circuit is normally free running, a gating transistor having a base, an emitter, and a collector, means for connecting the emitter of said gating transistor to the collector of a first ring circuit transistor, means for connecting the base of said gating transistor to the collector of a second ring circuit transistor preceding said first transistor in said ring circuit by an even number, first and second conductors, means for applying a signal to said first conductor, means including said first and second transistors for rendering said gating transistor conductive when said second transistor has changed its state of conduction but said first transistor has not changed its state of conduction during a given cycle of operation of said ring circuit and only if a signal is applied to said first conductor, means for applying an output signal to said second conductor whenever said gating transistor is conductive, and means for also coupling said output signal to the base of a ring circuit transistor to arrest the operation of said ring circuit.

6. A distributor comprising a ring circuit, said ring circuit comprising an odd number plurality of inverter amplifiers, each of said amplifiers comprising an input circuit and an output circuit, direct current conductive means for connecting the output circuit of each amplifier to the input circuit of the next succeeding amplifier, means including said direct current conductive means for biasing each of said amplifiers for conduction and non-conduction when the next preceding amplifier is non-conductive and conductive, respectively, so that said ring circuit is free running, gating means having first and second inputs, means for connecting said first input to the output circuit of a first one of said amplifiers, means for connecting said second input to the output circuit of a second one of said amplifiers preceding said first amplifier in said ring circuit by an odd number, and means in said gating means for producing an output signal only when the signals in the output circuits of said first and second amplifiers are alike.

7. A distributor comprising a ring circuit, said ring circuit comprising an odd number plurality of transistors of the same conductivity type and each having a base, an emitter, and a collector, direct current conductive means for connecting the collector of each transistor to the base of the next succeeding transistor, means including said direct current conductive means for biasing each of said transistors for conduction and non-conduction when the next preceding transistor is non-conductive and conductive, respectively, so that said ring circuit is free running, a gate comprising first and second unidirectional conducting devices each having first and second terminals, means for connecting the first terminal of said first device to the collector of a first one of said transistors, means for connecting the first terminal of said second device to the collector of a second one of said transistors which precedes said first transistor in said ring circuit by an odd number, means for connecting the second terminals of said first and second devices together, and said devices being so poled that an output signal is produced at said second terminals only when said first and second transistors are in the same state of conduction.

8. A distributor comprising a ring circuit, said ring circuit comprising an odd number plurality of transistors of the same conductivity type and each having a base, an emitter, and a collector, a plurality of resistors, a plurality of capacitors, a point of reference potential, means for connecting a pair of resistors in series between the collector of each transistor and the base of the next succeeding transistor, means for connecting one of said capacitors between the junction point of each pair of resistors and said point of reference potential, means for returning the emitter of each transistor to said point of reference potential, means including said pairs of resistors for biasing each of said transistors for conduction and non-conduction when the next preceding transistor is non-conductive and conductive, respectively, so that said ring circuit is free running, a gate comprising first and second unidirectional conducting devices each having first and second terminals, means for connecting the first terminal of said first device to the collector of a first one of said transistors, means for connecting the first terminal of said second device to the collector of a second one of said transistors which precedes said first transistor by an odd number, means for connecting the second terminals of said first and second devices together, and said devices being so poled that an output signal is produced at said second terminals only when said first and second transistors are in the same state of conduction.

9. A distributor comprising a ring circuit, said ring circuit comprising an odd number plurality of transistors of the same conductivity type and each having a base, an emitter, and a collector, direct current conductive means for connecting the collector of each transistor to the base of the next succeeding transistor, means including said direct current conductive means for biasing each of said transistors for conduction and non-conduction when the next preceding transistor is non-conductive and conductive, respectively, so that said ring circuit is normally free running, a gate comprising first, second, and third unidirectional conducting devices each having first and second terminals, a conductor, means for applying a signal to said conductor, means for connecting the first terminal of said first device to the collector of a first one of said transistors, means for connecting the first terminal of said second device to the collector of a second one of said transistors which precedes said first transistor in said ring circuit by an odd number, means for connecting said conductor to the first terminal of said third device, means for connecting the second terminals of said first, second, and third devices together, said devices being so poled that an output signal is produced at said second terminals only when said first and second transistors are in the same state of conduction and only if a signal is applied to said conductor, and means for coupling said output signal to the base of one of said transistors to arrest the operation of said ring circuit.

10. A distributor comprising a ring circuit, said ring circuit comprising an odd number plurality of inverter amplifiers, each of said amplifiers comprising an input circuit and an output circuit, direct current conductive means for interconnecting the output circuit of each amplifier and the input circuit of the next succeeding amplifier, means including said direct current conductive means for biasing each of said amplifiers for conduction and non-conduction when the next preceding amplifier is non-conductive and conductive, respectively, so that said ring circuit is free running and each amplifier changes its state of conduction during each cycle of operation of said ring circuit, gating means comprising first and second inputs, means for coupling the first input of said gating means to the output circuit of a first one of said amplifiers, means for coupling the second input of said gating means to the output circuit of a second one of said amplifiers preceding said first amplifier in said ring circuit, and means in said gating means for producing an output signal during each alternate cycle of operation of said ring circuit for the period of time elapsing from the time that said second amplifier changes its state of conduction until said first amplifier changes its state of conduction.

11. A distributor comprising a ring circuit, said ring circuit comprising an odd number plurality of inverter amplifiers, each of said amplifiers comprising an input circuit and an output circuit, direct current conductive means for interconnecting the output circuit of each amplifier and the input circuit of the next succeeding amplifier, means including said direct current conducting means for biasing each of said amplifiers for conduction and non-conduction when the next preceding amplifier is non-conductive and conductive, respectively, so that said ring circuit is free running and each amplifier changes its state of conduction during each cycle of operation of said ring circuit, a plurality of gating means, each of said gating means comprising first and second inputs, means for individually coupling the first inputs of said gating means to the output circuits of said amplifiers, means for individually coupling the second inputs of said gating means to the output circuits of said amplifiers with the second input of each gating means being connected to the output circuit of an amplifier preceding the amplifier to which the first input of that gating means is coupled, and means in each gating means for producing an output signal during each alternate cycle of operation of said ring circuit for the period of time elapsing from the time that the amplifier to which the second input of that gating means is coupled changes its state of conduction until the amplifier to which the first input of that gating means is coupled changes its state of conduction.

12. A distributor comprising a ring circuit, said ring circuit comprising an odd number plurality of transistors each having a base, an emitter, and a collector, direct current conductive means for coupling the collector of each transistor to the base of the next succeeding transistor, means including said direct current conductive means for biasing the base and emitter of each transistor in the forward direction and in the reverse direction when the transistor immediately preceding that transistor is non-conductive and conductive, respectively, so that said ring circuit is free running and each transistor changes its state of conduction during each cycle of operation of said ring circuit, gating means comprising first and second inputs, means for connecting the first input of said gating means to the collector of a first one of said transistors, means for connecting the second input of said gating means to the collector of a second one of said transistors preceding said first transistor in said ring circuit, and means in said gating means for producing an output signal during each alternate cycle of operation of said ring circuit for the period of time elapsing from the time that said second transistor changes its state of conduction until said first transistor changes its state of conduction.

13. A distributor comprising a ring circuit, said ring circuit comprising an odd number plurality of transistors each having a base, an emitter, and a collector, direct current conductive means for coupling the collector of each transistor to the base of the next succeeding transistor, means including said direct current conductive means for biasing the base and emitter of each transistor in the forward direction and in the reverse direction when the transistor immediately preceding that transistor is non-conductive and conductive, respectively, so that said ring circuit is free running and each transistor changes its state of conduction during each cycle of operation of said ring circuit, a plurality of gating means each having first and second inputs, means for individually coupling the first inputs of said gating means to the collectors of said transistors, means for individually coupling the second inputs of said gating means to the collectors of said transistors with the second input of each gating means being connected to the collector of a transistor preceding the transistor to which the first input of that gating means is coupled, and means in each gating means for producing an output signal during each alternate cycle of operation of said ring circuit for the time period elapsing from the time that the transistor to which the second input of that gating means is coupled changes its state of conduction until the transistor to which the first input of that gating means is coupled changes its state of conduction.

References Cited in the file of this patent

UNITED STATES PATENTS

| | | |
|---|---|---|
| 2,017,708 | Bedford | Oct. 15, 1935 |
| 2,470,716 | Overbeck | May 17, 1946 |
| 2,521,774 | Bliss | Sept. 12, 1950 |
| 2,586,409 | White | Feb. 19, 1952 |
| 2,591,961 | Moore | Apr. 8, 1952 |
| 2,628,309 | Hughes | Feb. 10, 1953 |
| 2,644,887 | Wolfe | July 17, 1953 |
| 2,735,939 | Forsberg | Feb. 21, 1956 |
| 2,774,875 | Keonjan | Dec. 18, 1956 |
| 2,810,843 | Granqvist | Oct. 22, 1957 |
| 2,850,566 | Nelson | Sept. 2, 1958 |
| 2,868,455 | Bruce et al. | Jan. 13, 1959 |